US012648104B2

(12) United States Patent
Danijel et al.

(10) Patent No.: US 12,648,104 B2
(45) Date of Patent: Jun. 2, 2026

(54) ELECTRIC POWER CONVERTER

(71) Applicant: MAHLE International GmbH, Stuttgart (DE)

(72) Inventors: Stolfa Danijel, Solkan (SI); Verdev Luka, Velenje (SI); Cimzar Blaz, Preddvor (SI)

(73) Assignee: Mahle International GmbH (DE)

( * ) Notice: Subject to any disclaimer, the term of this patent is extended or adjusted under 35 U.S.C. 154(b) by 201 days.

(21) Appl. No.: 18/608,767

(22) Filed: Mar. 18, 2024

(65) Prior Publication Data

US 2025/0294697 A1    Sep. 18, 2025

(51) Int. Cl.
| | |
|---|---|
| *H05K 7/14* | (2006.01) |
| *H02M 7/00* | (2006.01) |
| *H05K 7/20* | (2006.01) |

(52) U.S. Cl.
CPC ........ H05K 7/14322 (2022.08); H02M 7/003 (2013.01); H05K 7/209 (2013.01)

(58) Field of Classification Search
CPC .... H02M 7/003; H02M 7/5387; H02M 3/003; H02M 1/0054; H02M 1/088; H02M 1/44; H02M 7/537; H02M 1/00; H02M 1/0009; H02M 1/08; H02M 1/084; H02M 1/4258; H05K 7/209; H05K 2201/10166; H05K 5/0247; H05K 7/1432; H05K 2201/10598; H05K 7/20; H05K 7/20154; H05K 7/14322; H05K 7/20945; H05K 7/2089; H02K 11/33; H02K 11/30; H02K 5/225; H01L 2924/13055; H01L 2924/13091;

(Continued)

(56) References Cited

U.S. PATENT DOCUMENTS

| | | | | | |
|---|---|---|---|---|---|
| 5,466,974 | A | * | 11/1995 | Sutrina | H02B 1/20 |
| | | | | | 307/38 |
| 6,078,501 | A | * | 6/2000 | Catrambone | H02M 7/003 |
| | | | | | 174/50.56 |

(Continued)

FOREIGN PATENT DOCUMENTS

| | | |
|---|---|---|
| EP | 3609066 B1 | 2/2020 |
| EP | 3609068 A1 | 2/2020 |

OTHER PUBLICATIONS

European Search Report, EP22203848.1, dated May 3, 2023.
Indian Examination Report, IN202344071366, dated Mar. 2, 2026.

*Primary Examiner* — Michael A Matey
(74) *Attorney, Agent, or Firm* — Fishman Stewart PLLC

(57) ABSTRACT

An electronic control unit for an electrical machine of an electrically powered drive system may include at least one semiconductor board including a plurality of power semiconductors, a baseplate for dissipating heat generated in the electronic control unit, a plurality of power terminals for supplying power to the electronic control unit, and a plurality of phase terminals for supplying three phase current to the electric machine. The plurality of phase terminals may be connected to a plurality of terminal contacts disposed on the at least one semiconductor board. At least one phase terminal of the plurality of phase terminals may include a first stud for electrical connection to a plurality of field windings of the electric machine and a second stud for connection to one of the plurality of terminal contacts. The first stud and the second stud may be electrically connected via a connecting part.

20 Claims, 6 Drawing Sheets

(58) Field of Classification Search
CPC ....... B62D 5/0406; B62D 5/046; H02P 27/06;
B60K 1/00; B60L 2210/40; B60L
2210/30; H01G 2/06; H01G 2/08; H01H
85/00; H01H 9/54; H01R 12/58; H01R
12/585; H02B 1/04; H02B 1/20; H02G
3/081
See application file for complete search history.

(56) References Cited

U.S. PATENT DOCUMENTS

| | | | |
|---|---|---|---|
| 8,953,335 B2 | 2/2015 | Abe | |
| 11,129,270 B2 | 9/2021 | Hundt | |
| 2008/0205107 A1* | 8/2008 | Hattori | H05K 7/14322 |
| | | | 29/854 |
| 2009/0257211 A1* | 10/2009 | Kontani | H02M 7/003 |
| | | | 361/782 |
| 2017/0271224 A1* | 9/2017 | Hinata | H01L 23/16 |
| 2017/0291635 A1* | 10/2017 | Yamasaki | H02K 5/225 |
| 2020/0052605 A1* | 2/2020 | Babic | H01L 23/367 |
| 2020/0052609 A1* | 2/2020 | Babic | H05K 1/0204 |
| 2022/0201890 A1* | 6/2022 | Liu | H01F 27/36 |
| 2022/0208666 A1* | 6/2022 | Yang | H01L 23/49811 |
| 2023/0066734 A1* | 3/2023 | Rockstein | B62D 5/0406 |
| 2023/0116118 A1* | 4/2023 | Schuderer | H01L 23/49861 |
| | | | 257/774 |

* cited by examiner

ELECTRIC POWER CONVERTER

TECHNICAL FIELD

The invention relates to an electric control unit.

BACKGROUND

An electronic power inverter for an electrical machine is known for example in EP3609066B1. The power inverter comprises a housing with a semiconductor board, a capacitor board, power terminals and phase terminal studs. The capacitors of the capacitor board are received in recesses of a heat exchanger plate. The phase terminal studs rest on contacts of the semiconductor board and are biased towards the contacts of the semiconductor board by a pressing plate via the capacitor board and a damping plate.

SUMMARY

The electronic control unit according to the invention has the advantage that a risk of overheating of the phase terminals can be reduced, thus preventing damage to the electronic control unit.

This is achieved according to a first aspect of the invention with an electronic control unit for an electrical machine of an electrically powered drive system, the electric control unit comprising at least one semiconductor board having a plurality of power semiconductors, a baseplate for dissipating heat generated in the electronic control unit, power terminals for supplying power to the electronic control unit, a plurality of phase terminals for supplying three phase current to the electric machine, wherein the phase terminals are connected to terminal contacts on the at least one semiconductor board. At least one of the phase terminals comprises a first stud for electrical connection to field windings of the electric machine, the first stud extending in a direction away from the baseplate, and a second stud for connecting the phase terminal to one of the terminal contacts on the at least one semiconductor board, wherein the first and second stud are electrically connected via a connecting part, and the second stud extends into a recess in the baseplate.

Heat is generated in the area of connection of the phase terminal with the semiconductor board, and by providing this connection in the form of a stud which extends into a recess in the baseplate, heat can be efficiently transferred away from the area of the connection into the baseplate.

The baseplate can be a plate of cast aluminium, in which the recess is machined into. The baseplate preferably comprises heat dissipating fins and/or pins on a side facing away from semiconductor board.

The first stud, the second stud and the connection part are integrally formed in one piece out of metal. The number of connection points between a phase connection point on the semiconductor board and the field windings are therefore reduced, reducing sources of heat generation.

The first studs of the plurality of phase terminals and the power terminals are preferably arranged linearly adjacent to the semiconductor board when viewed in the stacking direction.

For the case that each phase terminal is connected to two terminal contacts on the semiconductor board, for example when the phase terminal is connected to two bridge arms of an inverter, the phase terminal can comprise a third stud for connecting the phase terminal to one of the terminal contacts on the at least one semiconductor board, wherein the second and third studs are electrically connected via a second connecting part, and the third stud also extends into a recess in the baseplate.

The recess in the baseplate can be a single recess into which the second and third studs extend. Alternatively there can be a plurality of separate recesses, one for each of the second and/or third studs.

The side walls of the respective recess are arranged in close proximity to the stud surface without contacting the stud surface. Heat can therefore be effectively transferred from the phase terminals to the baseplate by conduction. For this purpose, the gap between the stud surface and the baseplate in the area of the recess can be filled with a thermally conductive gap filling potting material.

The second stud is provided with a threaded hole and the second stud is attached to a side of the at least one semiconductor board facing the baseplate via a screw which extends through the semiconductor board into the threaded hole. The third stud can be similarly provided with a threaded hole and is attached to a side of the at least one semiconductor board facing the baseplate via a screw which extends through the semiconductor board into the threaded hole. The phase terminals are thus firmly attached to the electrical contact on the semiconductor board to minimize resistance and reduce heat generation.

The first studs can also be provided with a threaded hole for screw attachment of field windings.

A plurality of capacitors can also be connected to the semiconductor board and arranged on a side of the semiconductor board facing the baseplate, wherein the plurality of capacitors are received in recessed portion of the baseplate. The capacitors can be arranged in the same recess as the second or third phase terminal studs. Alternatively, the capacitors can be arranged in recesses separate from the recesses of the second or third phase terminal studs.

The electronic control unit can further comprise a holding bracket and resilient biasing means for biasing the power semiconductors towards the baseplate, wherein the holding bracket comprises means for attaching the resilient biasing means to holding bracket, and the holding bracket is attached to the baseplate. When the holding bracket is attached to the baseplate, the resilient means are sandwiched in the stacking direction between the holding bracket and the power semiconductors and bias the power semiconductors towards the baseplate to improve heat transfer away from the power semiconductors. The resilient biasing means can comprise a plurality of leaf springs.

BRIEF DESCRIPTION OF THE DRAWINGS

Embodiments will now be described by way of example only with reference to the accompanying drawings, in which.

DETAILED DESCRIPTION

Figure 1:
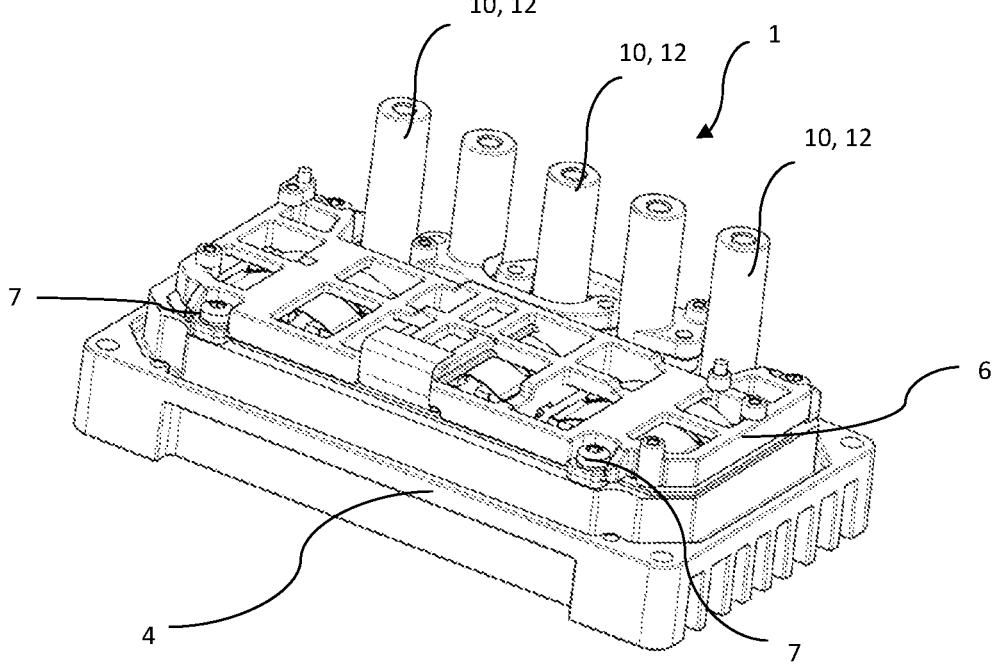
FIG. 1 is a perspective view of an electronic control unit according to the invention.
Figure 2:
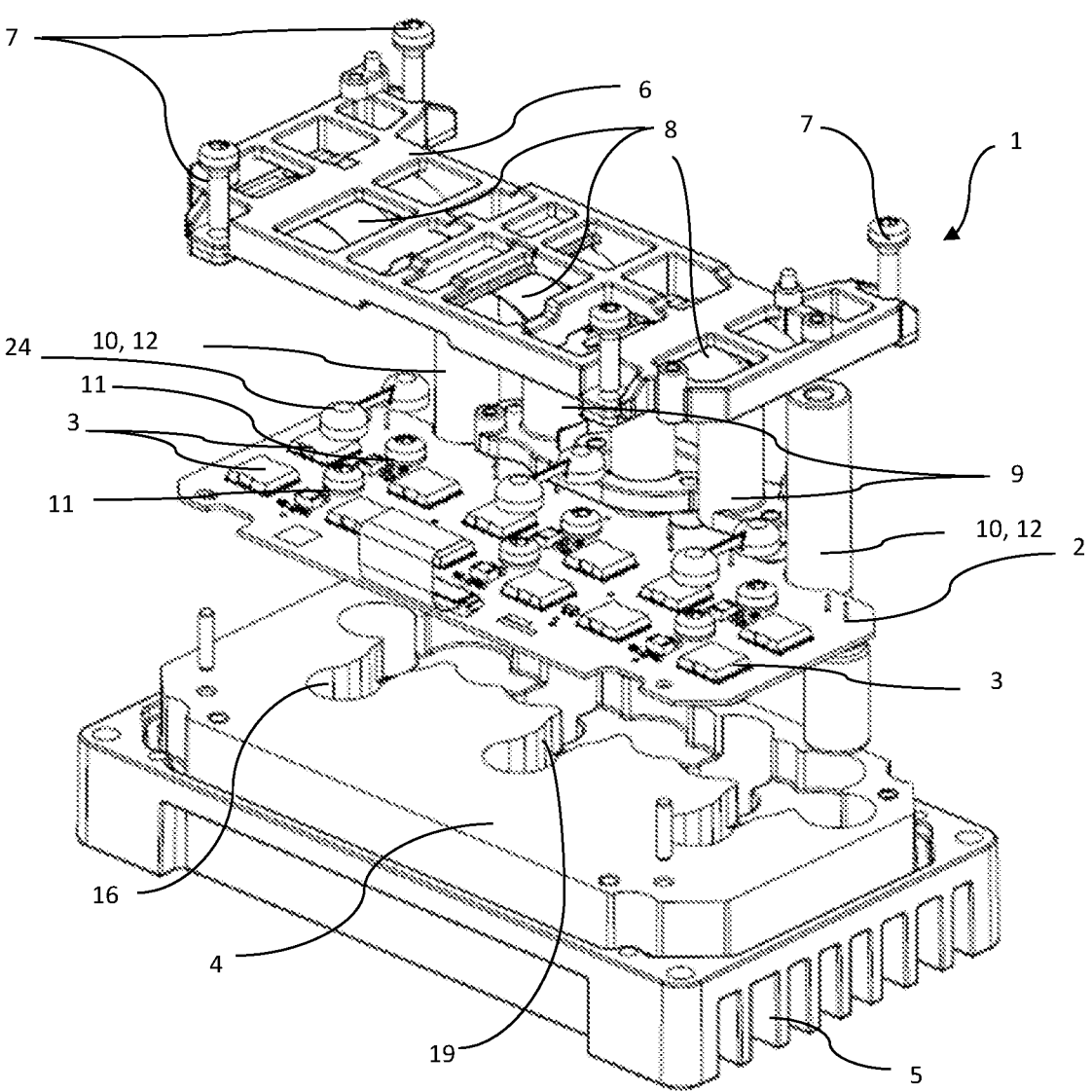
FIG. 2 is an exploded view of the electronic control unit in FIG. 1.
Figure 3:
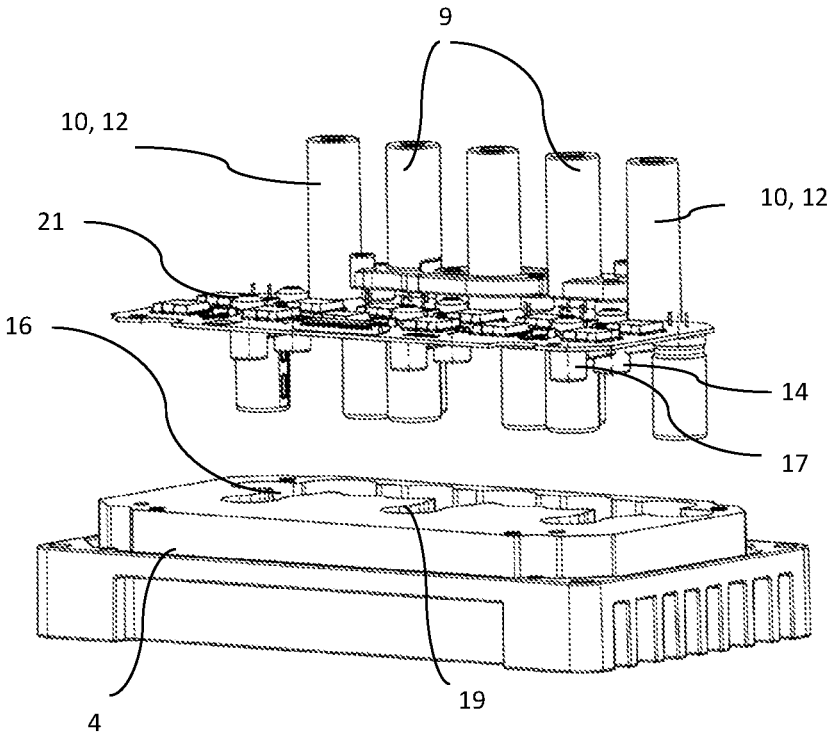
FIG. 3 is an exploded view of part of the electronic control unit in FIG. 1.
Figure 4:
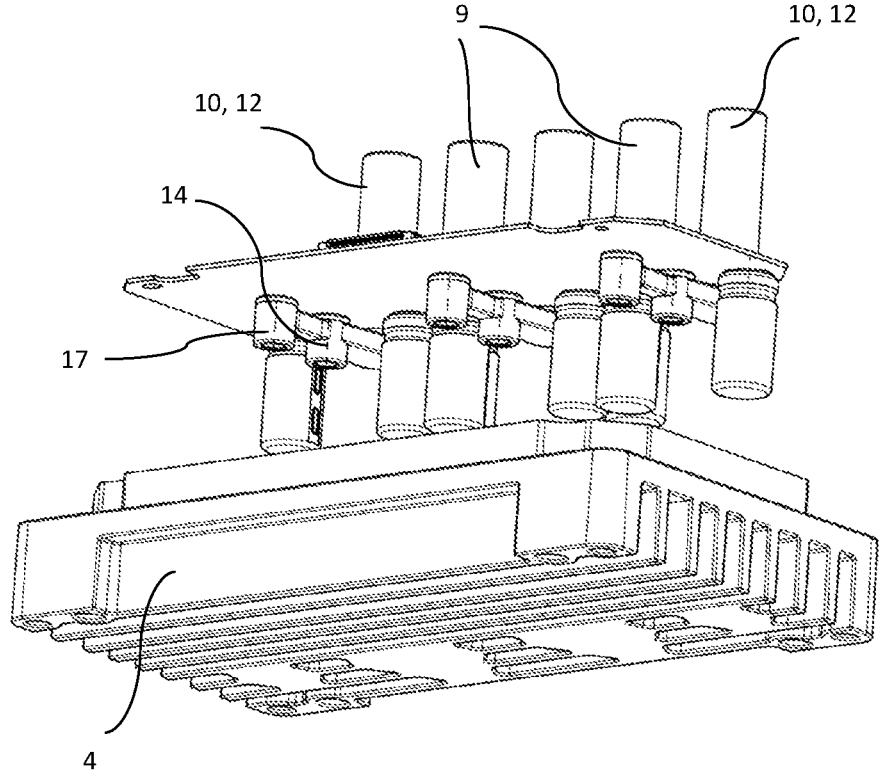
FIG. 4 is an exploded view from below of part of the electronic control unit in FIG. 1.
Figure 5:
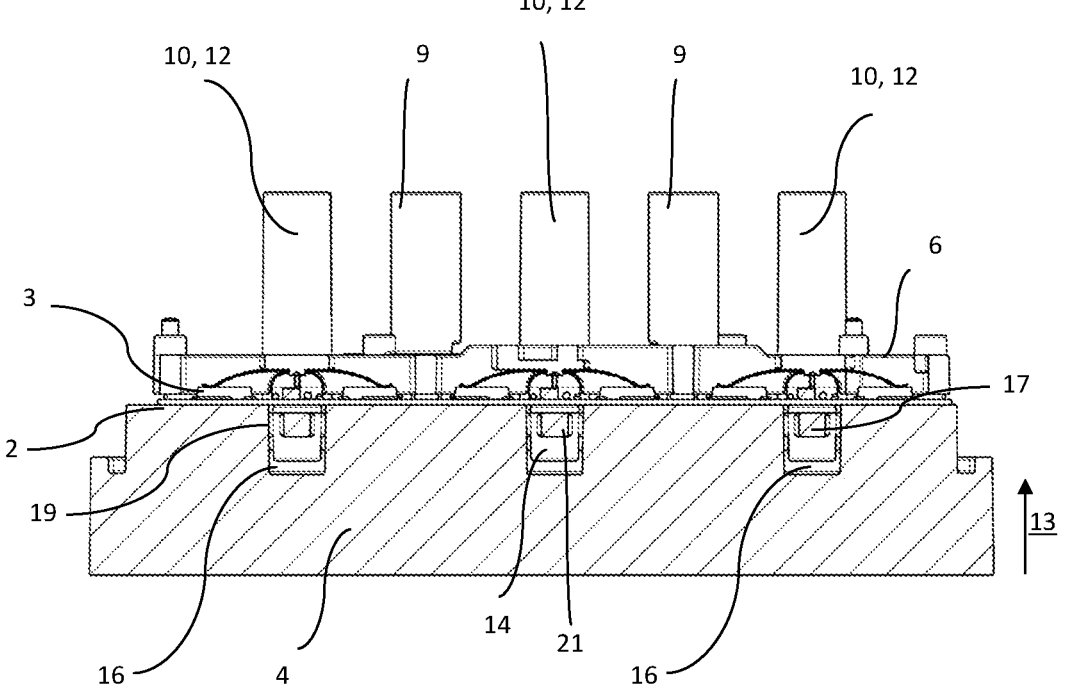
FIG. 5 is a cross-section view of the electronic control unit in FIG. 1.
Figure 6:
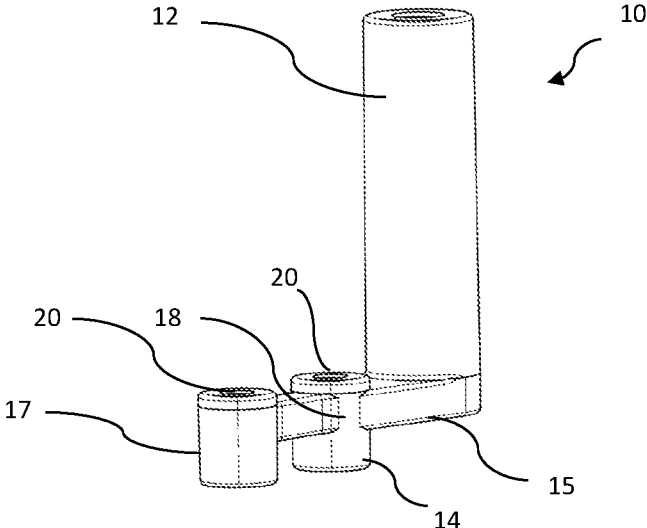
FIG. 6 is a perspective view of a phase terminal according to the invention.

With reference to the drawings, FIGS. 1 and 2 show an electronic control unit 1 according to the invention. The electronic control unit 1 can be used for example as an inverter for an electrical machine of an electrically powered drive system. The electronic control unit 1 comprises at least one semiconductor board 2 having a plurality of power semiconductors 3 and a baseplate 4 for dissipating heat generated in the electronic control unit 1. The electronic control unit 1 further comprises power terminals 9 for supplying power to the electronic control unit 1 and a plurality of phase terminals 10 for supplying three phase current to the electric machine. The phase terminals 10 are connected to terminal contacts 11 on the at least one semiconductor board 2. FIG. 6 shows one of the phase terminals 10. The phase terminal 10 comprises a first stud 12 for electrical connection to field windings of an electric machine (not shown). As can be seen in FIG. 5 the first studs 12 extend in a direction away from the baseplate 4 and are positioned above the baseplate 4 in the stacking direction 13. The stacking direction 13 is the direction in which the semiconductor board 2 is stacked upon the baseplate 4.

The first studs 12 of the plurality of phase terminals 10 and the power terminals 9 are arranged in a line adjacent to the semiconductor board 2 when viewed in the stacking direction 13.

The phase terminal 10 comprises a second stud 14 for connecting the phase terminal 10 to one of the terminal contacts 11 on the semiconductor board 2. The first and second studs 12, 14 are electrically connected via a connecting part 15. The first stud 12, the second stud 14 and the connection part 15 are integrally formed in one piece out of metal.

According to the invention the second stud 14 extends into a recess 16 in the baseplate 4. Heat generated in the area of connection of the phase terminal 10 with the semiconductor board 2 can therefore be efficiently transferred away from the area of the connection via conduction from the second stud 14 into the baseplate.

The baseplate 4 can be a plate or block of cast aluminium, in which the recess 16 is machined into. The baseplate 4 preferably comprises heat dissipating fins 5 and/or pins on a side facing away from semiconductor board 2.

In the embodiment shown in the figures each phase terminal 10 is connected to two terminal contacts 11 on the semiconductor board 2. This is necessary for example when the phase terminal 10 is connected to two bridge arms of an inverter. In this case the phase terminal 10 has a third stud 17 for connecting the phase terminal 10 to one of the terminal contacts 11 on the at least one semiconductor board 2. The second and third studs 14, 17 are electrically connected via a second connecting part 18, and the third stud 17 also extends into a recess 16 in the baseplate 4.

The recess 16 in the baseplate 4 in the embodiment shown is a single recess 16 into which the second and third studs 14, 17 extend in the stacking direction 13. Alternatively there can be a plurality of separate recesses 16, one for each of the second and/or third studs 14, 17, or a plurality of recesses 16 which each contain a plurality of second and/or third studs 14, 17 respectively.

As can be seen in FIG. 5, portions of the side walls 19 of the respective recess 16 are arranged in close proximity to the stud surface of the second and/or third studs 14, 17 without contacting the stud surface. Heat can therefore be effectively transferred from the phase terminals 10 to the baseplate 4. For this purpose the recess can be filled with a heat conducting filler material to facilitate the conduction of heat away from the studs 14, 17 into the baseplate 4. The second and third studs 14, 17 have a generally cylindrical shape.

The space between the recess 16 and the second and third studs 14, 17 can be filled with a potting substance, for example a silicone gel, in order to improve heat transfer away from the phase terminal 10.

The second and third studs 14, 17 are each provided with a threaded hole 20 and the second and third studs 14, 17 are attached to a side of the at least one semiconductor board 2 facing the baseplate 4 via a screw 21 which extends through the semiconductor board 2 into the threaded hole 20. The phase terminals 10 are thus firmly attached to the terminal contact 11 on the semiconductor board 2 to minimize resistance and reduce heat generation. The heads of the screws 21 can be covered with an insulation cap 24, preferably made out of plastic, to prevent contact with other parts of the electronic control device 1, in particular to prevent electrical contact between the heads of the screws 21 and a holding bracket 6 which can be made out of aluminium.

The first studs are also be provided with a threaded hole 22 for screw attachment of field windings.

A plurality of capacitors 23 are connected to the semiconductor board and arranged on a side of the semiconductor board 2 facing the baseplate 4, wherein the plurality of capacitors 23 are received in a recessed portion 16 of the baseplate 4. The capacitors 23 can be arranged in the same recess as the second or third phase terminal studs 14, 17. Alternatively, the capacitors 23 can be arranged in recesses separate from the recesses 16 of the second or third phase terminal studs 14, 17.

The electronic control unit 1 has a holding bracket 6, preferably made out of alumium, and resilient biasing means 8 for biasing the power semiconductors 3 towards the baseplate 4, wherein the holding bracket 6 comprises means for attaching the resilient biasing means 8 to holding bracket 6, and the holding bracket 6 is attached to the baseplate 4 via screws 7. When the holding bracket 6 is attached to the baseplate 4, the resilient means 8 are sandwiched in the stacking direction between the holding bracket 6 and the power semiconductors 3 and bias the power semiconductors 3 towards the baseplate 4 to improve heat transfer away from the power semiconductors 3. The resilient biasing means can comprise a plurality of leaf springs 8.

LIST OF REFERENCE NUMERALS

1. Electronic control unit
2. Semiconductor board
3. Power semiconductors
4. Baseplate
5. Cooling fins
6. Holding bracket
7. Screws
8. Leaf spring
9. Power terminal
10. Phase terminal
11. Terminal contact
12. First stud
13. Stacking direction
14. Second stud
15. Connecting part
16. Recess
17. Third stud
18. Second connecting part
19. Side wall
20. Threaded hole
21. Screw
22. Threaded hole 23. Capacitors
24. Insulation cap

The invention claimed is:

1. An electronic control unit for an electrical machine of an electrically powered drive system, the electronic control unit comprising:
   at least one semiconductor board including a plurality of power semiconductors;
   a baseplate for dissipating heat generated in the electronic control unit;
   a plurality of power terminals for supplying power to the electronic control unit; and
   a plurality of phase terminals for supplying three phase current to the electric machine;
   wherein the plurality of phase terminals are connected to a plurality of terminal contacts disposed on the at least one semiconductor board; and
   wherein at least one phase terminal of the plurality of phase terminals includes:
      a first stud for electrical connection to a plurality of field windings of the electric machine, the first stud extending in a direction away from the baseplate; and
      a second stud for connecting the at least one phase terminal to one of the plurality of terminal contacts the first stud and the second stud electrically connected via a connecting part, and the second stud extending into a recess disposed in the baseplate.

2. The electronic control unit according to claim 1, wherein the first stud, the second stud, and the connecting part are integrally formed as one piece and the one piece is composed of metal.

3. The electronic control unit according to claim 1, wherein:
   the at least one phase terminal further includes a third stud for connecting the at least one phase terminal to one of the plurality of terminal contacts;
   the second stud and the third stud are electrically connected via a second connecting part; and
   the third stud extends into a second recess disposed in the baseplate.

4. The electronic control unit according to claim 3, wherein:
   a plurality of side walls of the recess are arranged in close proximity to a stud surface of the second stud without contacting the stud surface of the second stud; and
   a plurality of side walls of the second recess are arranged in close proximity to a stud surface of the third stud without contacting the stud surface of the third stud.

5. The electronic control unit according to claim 1, wherein:
   the second stud includes a threaded hole; and
   the second stud is attached to a side of the at least one semiconductor board facing the baseplate via a screw extending through the at least one semiconductor board into the threaded hole.

6. The electronic control unit according to claim 1, further comprising a plurality of capacitors connected to the at least one semiconductor board and arranged on a side of the at least one semiconductor board facing the baseplate, wherein the plurality of capacitors are received in a recessed portion of the baseplate.

7. The electronic control unit according to claim 1, further comprising:
   a resilient biasing mechanism biasing the plurality of power semiconductors towards the baseplate; and a holding bracket attached to the resilient biasing mechanism and attached to the baseplate.

8. The electronic control unit according to claim 7, wherein the resilient biasing mechanism includes a plurality of leaf springs.

9. The electronic control unit according to claim 1, wherein the baseplate includes at least one of a plurality of heat dissipating fins and a plurality of heat dissipating pins disposed on a side facing away from the at least one semiconductor board.

10. The electronic control unit according to claim 1, wherein a plurality of side walls of the recess are arranged in close proximity to a stud surface of the second stud without contacting the stud surface.

11. The electronic control unit according to claim 1, further comprising a heat conducting filler material disposed in the recess.

12. The electronic control unit according to claim 1, wherein the first stud includes a threaded hole and the plurality of field windings of the electric machine are attachable to the first stud via a screw engaging the threaded hole of the first stud.

13. The electronic control unit according to claim 1, further comprising a plurality of capacitors connected to the at least one semiconductor board and extending into the recess of the baseplate.

14. The electronic control unit according to claim 3, wherein the recess and the second recess are a single common recess into which both the second stud and the third stud extend.

15. The electronic control unit according to claim 3, wherein the first recess and the second recess are separate recesses.

16. The electronic control unit according to claim 3, wherein the second stud and the third stud are each cylindrical shape.

17. The electronic control unit according to claim 4, further comprising a thermally conductive potting material disposed within and filling (i) a first gap defined between the plurality of side walls of the recess and the stud surface of the second stud and (ii) a second gap defined between the plurality of side walls of the second recess and the stud surface of the third stud.

18. The electronic control unit according to claim 17, wherein the potting material is a silicone gel.

19. The electronic control unit according to claim 7, further comprising:
   a screw extending through the at least one semiconductor board and connecting the second stud to a side of the at least one semiconductor board facing the baseplate; and
   an insulation cap covering a screwhead of the screw and preventing electrical contact between the screwhead and the holding bracket.

20. An electronic control unit for an electrical machine of an electrically powered drive system, the electronic control unit comprising:
   at least one semiconductor board including a plurality of power semiconductors;
   a plurality of terminal contacts disposed on the at least one semiconductor board;
   a plurality of capacitors connected to the at least one semiconductor board;
   a baseplate for dissipating heat;
   a plurality of power terminals; and a plurality of phase terminals via which three phase current is suppliable to the electric machine, the plurality of phase terminals connected to the plurality of terminal contacts;

wherein at least one phase terminal of the plurality of phase terminals includes:

a first stud via which the at least one phase terminal is electrically connectable to a plurality of field windings of the electric machine, the first stud extending in a direction away from the baseplate;

a second stud connecting the at least one phase terminal to a first terminal contact of the plurality of terminal contacts;

a third stud connecting the at least one phase terminal to a second terminal contact of the plurality of terminal contacts;

a first connecting part electrically connecting the first stud and the second stud; and a second connecting part electrically connecting the second stud and the third stud; and wherein the second stud, the third stud, and the plurality of capacitors extend into a recess of the baseplate.

\* \* \* \* \*